United States Patent [19]

Welch et al.

[11] Patent Number: 4,633,470
[45] Date of Patent: Dec. 30, 1986

[54] ERROR CORRECTION FOR ALGEBRAIC BLOCK CODES

[75] Inventors: Lloyd R. Welch, La Canada; Elwyn R. Berlekamp, Berkeley, both of Calif.

[73] Assignee: Cyclotomics, Inc., Berkeley, Calif.

[21] Appl. No.: 536,951

[22] Filed: Sep. 27, 1983

[51] Int. Cl.[4] .............................................. G06F 11/10
[52] U.S. Cl. ........................................ 371/37; 371/38
[58] Field of Search ...................... 371/37, 38, 39, 40

[56] References Cited

U.S. PATENT DOCUMENTS

| | | | |
|---|---|---|---|
| 3,668,632 | 6/1972 | Oldham | 371/38 |
| 3,742,449 | 6/1973 | Blair | 371/39 |
| 4,201,976 | 5/1980 | Patel | 371/50 |
| 4,410,989 | 10/1983 | Berlekamp | 371/40 |
| 4,413,339 | 11/1983 | Riggle et al. | 371/38 |

OTHER PUBLICATIONS

IEEE Trans. on Communic. v. COM 24, Apr. '76, Po Hsiin Chen, "Multisequence Linear Shift, Shift Register Synthesis and its Application to BCH Decoding".

IEEE Trans. on Inf. Theory, v.IT-22, Mar. '76, Justeson, J: "On the Complexity of Decoding Reed Solomon Codes".

IBM Technical Disclosure Bull., v.22, Apr. '80; F<-J<Aichelman, et al; "High Data Integrity Scheme for Memory Reliability".

IEEE Trans. on Inf. Theory, IT-17, Nov. '71, Mandelbaum, "On Decoding Reed Solomon Codes", pp. 707-712.

IEEE Trans on Inf. Theory, IT-22, Sugiyama, et al, "An Erasures and Errors Decoding Algorithm for Goppa Codes", pp. 238-241, Mar. '76.

IEEE Trans on Inf. Theory, IT-18, May '72, Hartman, "Decoding Beyond the BCH Bound", pp. 441-444.

*Primary Examiner*—Charles E. Atkinson
*Attorney, Agent, or Firm*—E. H. Berkowitz

[57] ABSTRACT

Error correction for polynomial block codes is achieved without prior evaluation of power sum symmetric functions. The received word R (z) is reduced mod G (z), the generator of the code and a function F (z) of error locator polynomial W(z), errata values Y and code dependent functions $f(x_i)$ of the error positions $x_i$ given by

$$F(z) = \sum_{i=1}^{e} \frac{Y_i}{f(x_i) W(z)}$$

is decomposed into a rational polynomial function N (z)/W (z) for which deg (N (z)) < deg ( W (z) ) < number of correctable errors. W (z) is the error locator polynomial, the roots of which are the errata locations X and Y, the correction to the received character is obtained from $$\frac{N(z)}{f(z) W(z)}$$

evaluated at $X_i$ using non-erased check symbols of R (z). Correction is carried out in a crossbar switch structure which recalls a stored copy of R (z) and corrects bits as specified by ($X_i$, $Y_i$). Another embodiment interposes a matrix transform to transform the symbols of the received word so as to treat a selected set of symbols as erased checks and to present error location corrections directly to the crossbar. Only when changes occur in the pattern of errata is this error corrector apparatus required to operate and to redetermine the transform executed on incoming data R (z).

2 Claims, 8 Drawing Figures

ERROR CORRECTION FOR ALGEBRAIC BLOCK CODES

FIELD OF THE INVENTION

The present invention relates to forward error correction of block coded digital data streams.

BACKGROUND OF THE INVENTION

It is conventional in error correction systems for block codes to compute the power sum symmetric functions of the error location weighted error values. These quantities $S_k$ disclose the number of errata (errors and erasures). Error location polynomials are then computed for the block using the $S_k$. Finally, a correction procedure is applied to the now known error locations to recover the correct value for the erroneous symbol(s).

Alternate procedures are known which avoid the initial determination of the $S_k$. One example of such error correction apparatus is Meggit, IRE Trans. Inf. Theory, IT-7, pp. 234–244, October 1961. This and similar examples of prior art are nonalgebraic systems which exploit some specific aspect of a particular code structure. Such techniques are not generally applicable and in particular are inapplicable to algebraic codes which are favored in many applications. The distinction between algebraic and nonalgebraic codes is adequately discussed in Clark and Cain, Error Correction Coding for Digital Communication, chpt 3, Plenum Press, 1981.

It is an object of the invention to implement an algebraic error correction system for block codes which does not require the prior computation of power sum symmetric functions, $S_k$ for correction of errata.

It is another object of the invention to dynamically re-allocate the code symbols between message and redundancy symbols whereby the errata correction rate is optimized.

DETAILED DESCRIPTION OF THE INVENTION

The initial step in the procedure of the present invention is the derivation of the remainder polynomial coefficients $r_0, r_1, \ldots r_k$ which are obtained from the received word $R(z)$ by finite field operation with the generator polynomial $G(z)$ of the code:

$$r(z) = R(z) \bmod G(z)$$

The code is characterized by a distance, d, and a generator polynomial $G(z)$, $$G(z) = \prod_{i=L+1}^{L+d-1} (z - \alpha^i) = \sum_{i=0}^{d-1} G_i z^i$$

where $\alpha^i$ is a primitive element of a field of characteristic two and L is an integer which may be chosen to simplify the encoding process. See Berlekamp, Algebraic Coding Theory, chpt. 10, McGraw-Hill, 1968. For specificity, reference will often be made to the application of this work to Reed-Solomon codes. One of average skill in the art will perceive that aspects of the invention can be applied to other maximum distance separable codes. Cf Berlekamp, chpt 13.

The reduction of $R(z)$ to $r(z)$ is conventionally obtained in a feedback shift register or other appropriate device.

The received word is a sum of the transmitted codeword $C(z)$ and some channel error pattern $E(z)$. The transmitted (encoded) word $C(z)$ is "codeword", that is, a multiple of $G(z)$ and therefore $$r(z) = E(z) \bmod G(z)$$

Therefore the decoder may evaluate $r(z)$ at the roots of $G(z)$ for $k=L+1, k=L+2, \ldots k=L+d-1$ where $$r(\alpha^k) = E(\alpha^k) \qquad \text{equ. (1)}$$

This relationship may be expressed in terms of the error locations labeled $e_1, e_2, \ldots e_j$ and corresponding error values $y_j$ $$E(\alpha^k) = \sum_i Y_i^1 \alpha^{kei} = \sum_i Y_i X_i^k) \qquad \text{equ. (2)}$$

with $X_i = \alpha^{ei}$. The quantity $E(\alpha^k)$ is the weighted sum of the $k^{th}$ powers of the field error locations and it is conventional to first determine these power sum symmetric functions (often imprecisely called "syndromes"). A distinguishing attribute of the present invention is the direct determination of the quantities $X_i$ and $Y_i$ without reference to such power sums.

The process is more easily understood in its developoment for the simple case of a single error of value Y at message location X. For $k=L+1, L+2, \ldots L+d-1$ $$r(\alpha^k) = YX^k \qquad \text{equ. (3)}$$

and for $k=L+2, L+3, \ldots L+d-1$, $$r(\alpha^k) - Xr(\alpha^{k-1}) = YX^k - XYX^{k-1} = 0 \qquad \text{equ. (4)}$$

Thus, the polynomial $R(z) - Xr(\alpha^{-1}z)$ has roots $z = \alpha^{L+2}, \alpha^{L+3}, \ldots \alpha^{L+d-1}$. From this, it can be shown that this polynomial must be a multiple of $g(z)$ given by $$g(z) = \prod_{i=L+2}^{L=d-1} (z - \alpha^i) = G(z)/(z - \alpha^{L+1}) = \sum_{i=0}^{d-2} g_i z^i \qquad \text{equ. (5)}$$

Moreover, $r(z) - Xr(\alpha^{-1}z)$ is a scalar multiple of $g(z)$ because the degree of $g(z) = d-2$ and the degree of $r(z) < (d-1)$.

Therefore, $$r_k(1 - X\alpha^{-k}) = Ag_k$$

where A is the scalar multiple. There is a distinction to be noted for the occurrence of the hypothetical error at a check location $X = \alpha^j$, $j = 0, 1, 2 \ldots d-2$, and the occurrence of error in the message portion of the codeword where $j > (d-2)$. For the case where the error is in the check portion of the codeword, the polynomial $r(z) - Xr(\alpha^{-1}z) = 0$. Therefore the scalar multiple A must also vanish.

The (message) error locator polynomial is defined for a single error as $$W(\alpha^k) = \alpha^k - X \qquad \text{equ. (6)}$$

and from the above for $k = 0, 1, \ldots, d-2$ (for check symbol locations $\alpha^k$)

$$r_k W(\alpha^k) = A\alpha^k g_k$$

The error value Y corresponding to the postulated erroneous symbol can be found from equation (3) above as $$Y = X^{-L-1} r_k(\alpha^{L+1}) = X^{-L-1} \sum_{k=0}^{d-2} r_k \alpha^{(L+1)k}$$

If the error is in a message position, then for $k = 0, 1, \ldots, d-2$, there is obtained (for the limited example of a single error)

remainder polynomial:

$$r_k = A\alpha^k g_k / W(\alpha^k) \qquad \text{equ. (7)}$$

message error value:

$$Y = AX^{-L-1} \sum_{k=0}^{d-2} \frac{g_k \alpha^{(L+1)k}}{W(\alpha^k)} \qquad \text{equ. (8)}$$

$$= AX^{-L-1} \sum_{k=0}^{d-2} \frac{g_k \alpha^{(L+2)k}}{\alpha^k - X}$$

$$= A f(X)$$

The function f(X) for message positions $X = \alpha^{d-1}, \alpha^d, \alpha^{d+1}, \ldots \alpha^{-3}, \alpha^{-2}, \alpha^{-1}$, $$f(X) = X^{-L-1} \sum_{k=0}^{d-2} g_k \alpha^{(L+2)k}/(\alpha^{-k} - X) \qquad \text{equ. (9)}$$

depends only upon the structure of the code and can be precomputed for storage. In like manner the coefficients $g_k$ may also be placed in tabular form for determination of $W(\alpha^k)$ from the remainder polynomial.

In practice, the set of non-zero constants $g_0, g_1, \ldots g_{d-2}$ are used together with the received word R(z) to obtain the remainder polynomial coefficients $r_k$, each of which is expressed as a byte of data. In the absence of error, the received word is a codeword and the $r_k = 0$ for all k. The error correction process, in such instance need proceed no further.

To summarize the model single error example, the coefficients $r_k$ of the remainder polynomial r(z) are expressly given for an error of value Y at message location X by $$r_k = Yg_k \alpha^k / (f(X)(\alpha^k - X)) \qquad \text{equ. (10)}$$

for $k = 0, 1, 2, \ldots, d-2$.

The above example is principally of pedagogical value. For practical application the technique is to be generalized to the case of multiple errors in the codeword. This generalization is guided by considerations of linearity which must obtain for a plurality of errors e at message locations $X_1, X_2, \ldots X_e$ exhibiting erroneous values $Y_1, Y_2, \ldots Y_e$. In like manner, error is distributed at check locations $X_{e+1}, X_{e+2}, \ldots X_t$, bearing the erroneous check values $Y_{e+1}, Y_{e+2}, \ldots Y_t$. The generalization of the single (message) error expression (equ. 10) above gives $$r_k = g_k \alpha^k \sum_{i=1}^{e} \frac{Y_i}{f(X_i)(\alpha^k - X_i)} \qquad \text{equ. (11)}$$

subject to the constraint that $\alpha^k$ are correct check locations.

The structure of the above equation suggests that the poles of the summed expression are the message error locations. The message error locator polynomial is defined as $$W(z) = \prod_{i=1}^{e} (z - X_i) \qquad \text{equ. (12)}$$

Accordingly, the rational function $$F(z) = \sum_{i=1}^{e} \frac{Y_i}{f(X_i) W(z)} = \frac{N(z)}{W(z)} \qquad \text{equ. (13)}$$

contains the necessary information if N(z) can be ascertained. The degree of N(z) is constrained to be less than the degree of W(z) and the degree of W(z) is required to be less than the maximum number of errata correctable. By systematic search, the roots of W(z) are determined. The roots of W(z) correspond to error locations: thus there are further constraints in any practical application. The number of roots cannot exceed the degree of W(z) and, especially in regard to a shortened code, the roots must be located within the allowed region of the code.

At the roots, $z = X_i$ one can determine the value $Y_i$ by application of L'Hopital's rule to the relation (13) above.

$$\frac{Y_i}{f(X_i)} = \frac{N'(X_i)}{W'(X_i)} \qquad \text{equ (13a)}$$

from which $Y_i$ can be obtained using the corresponding quantity $f(X_i)$ stored in prom and evaluating the derivative of W with respect to z at $z = X_i$.

By an iterative technique, the sequence of polynomials $W^{(0)}(z), W^{(1)}(z), \ldots W^{(d-1)}(z)$ and corresponding sequence $N^{(0)}(z), N^{(1)}(z), \ldots N^{(d-1)}(z)$ are generated leading to the relation expressed by equation 13 and subject to constraint on the relative degree of the respective polynomials and a limit on correctable number of errata through a maximum degree of W(z). The iterative technique requires introduction of a corresponding pair of sequences of auxiliary polynomials M(z) and V(z) as set forth in FIG. 2a. The auxiliary polynomial will be recognized as an implementation of the LaGrange interpolation method applied to the present procedure.

Figure 1:
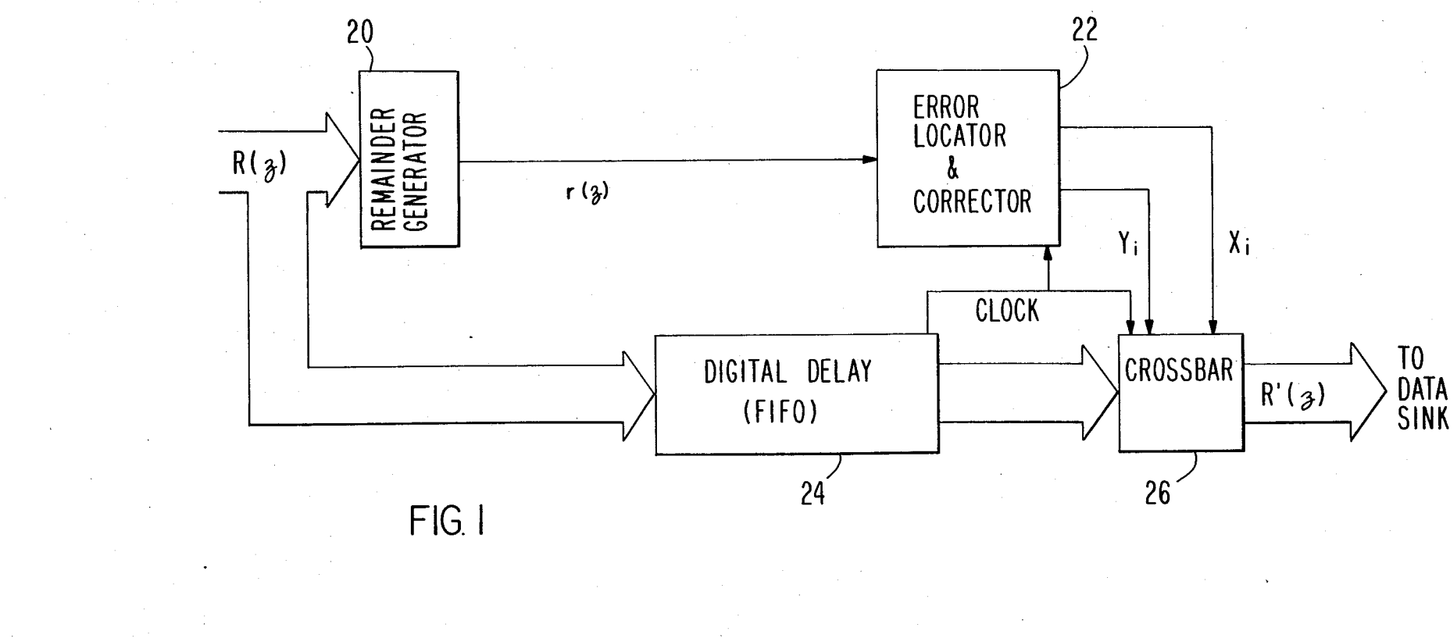
FIG. 1 shows the operating constituents of the invention.

The operating constituents of the invention are illustrated in FIG. 1 where data (the received word, R(z),) from a de-modulator are presented to remainder generator 20. This apparatus is similar to well known encoders and ordinarily comprises a feedback shift register configured to execute the reduction of R(z) mod G(z). Apparatus such as that described in USSN 215,361 and now U.S. Pat. No. 4,410,989, issued Oct. 18, 1983 is preferred for this purpose but the choice of this operating component will be determined from many considerations. The output of remainder generator 20 then enters error corrector 22 which is functionally described in FIGS. 2a & 2b. In parallel with this processing the received word R(z) enters a digital delay 24 from which it emerges to receive the corrections determined by error corrector 22 (and/or check symbol corrector not shown). Digital delay 24 may be realized in any of several satisfactory devices: a preferred choice is a fifo register which typically clocks error corrector 22. A simple buffer memory will serve also. (The very significant practical problems in channel data rate and the operating speed of the several components are not essential to the exegesis of the invention. The timing considerations are treated as in prior art error correction systems.) Correction of errata in the check symbols need not be considered for the limited purposes of the present embodiment and will be deferred to a further embodiment discussed below where a check symbol corrector is a subcomponent of error corrector 22 which operates upon errata located in the check portion of the word under scrutiny. In practical application, an encoder, realized in any of diverse forms will serve. Data rates in the error recovery system will limit acceptable choices for this component as will other factors such as cost, etc. As will be described below the check corrector also includes apparatus for comparing the re-encoded word with the received word to establish locations of errata in the check portion of the word. Correct code symbols are substituted for errata by crossbar switch 26. The received word R(z) is retrieved from the delay 24 and crossbar 26 adds corrected symbol values $Y_i$ to the received values at the corresponding positions $X_i$. The crossbar 26 is readily implemented from an array of demultiplexers (see FIG. 6) and resembles the well known electromechanical device from which the term derives. If check symbols are not required in further processing the message symbols are transmitted to the data sink and the redundancy is discarded by the crossbar 26.

Figure 2A:
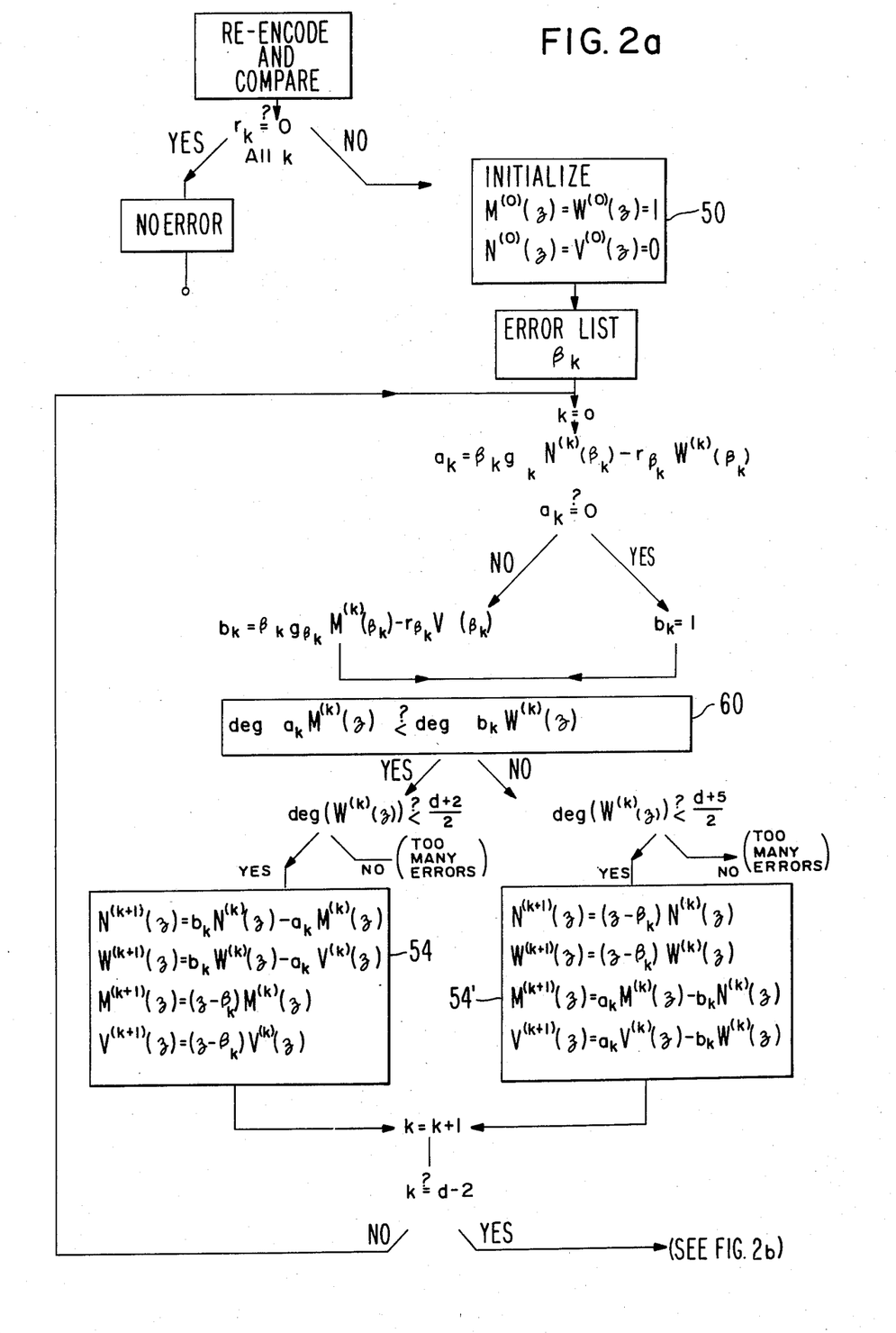
FIGS. 2a and 2b describe an embodiment suitable for nonerasing systems.
Figure 2B:
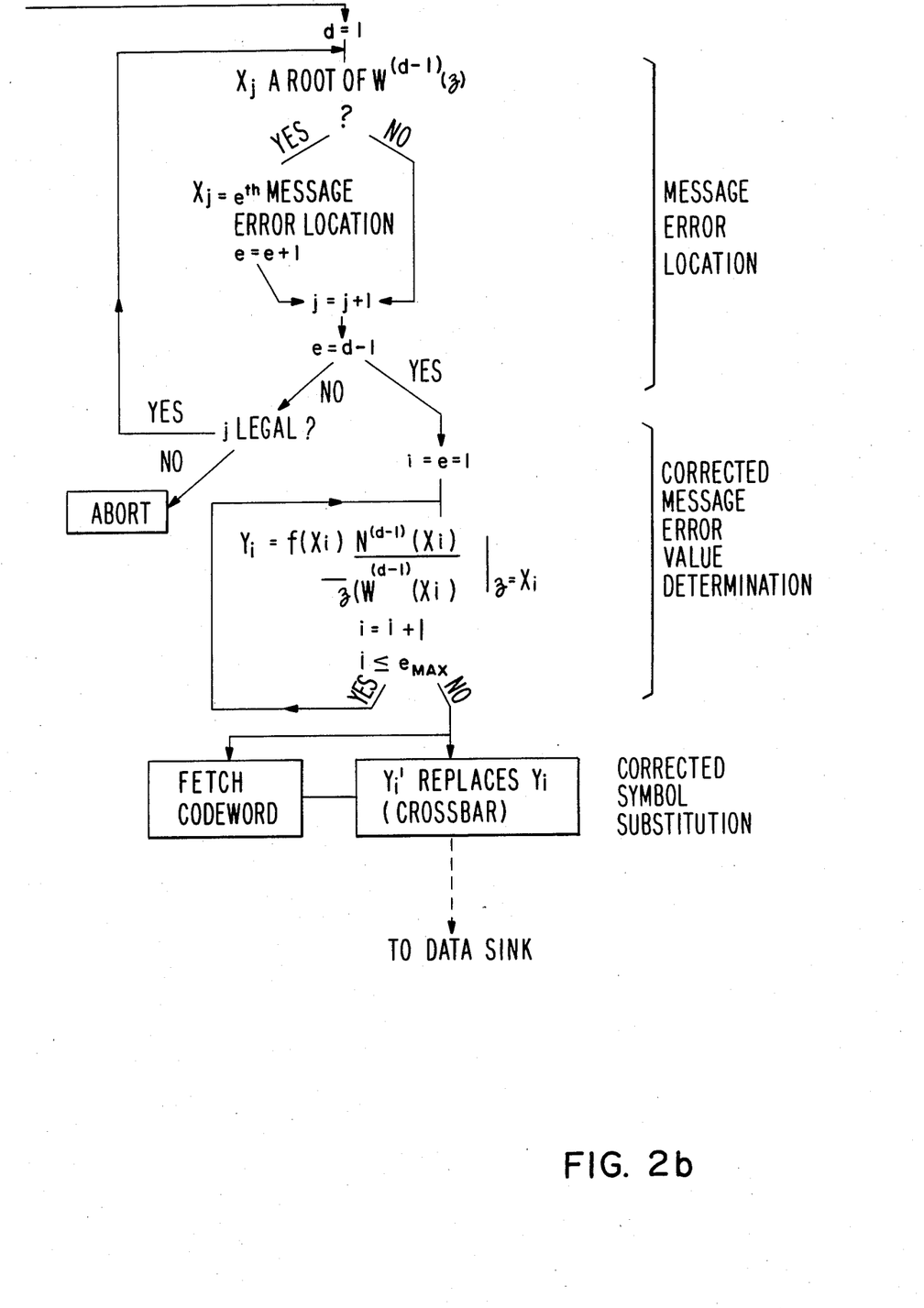

A first embodiment is further described in FIGS. 2a and 2b in flow chart form for the operation of a major portion of error corrector 22 following the generation of the remainder polynomial from the current incoming information unit, or received word. This embodiment assumes that no erasures are created by the demodulator, de-interleaver, remainder generator or like apparatus through which incoming data is processed prior to error correction.

FIG. 2a describes a portion of the processing after the received word R(z) has been reduced mod G(z) to obtain the remainder polynomial r(z). This portion of the invention may be compactly characterized as the decomposition of R(z) into the rational polynomial function $N^{(d-1)}/W^{(d-1)}$. The iterative relationships are selected at blocks 54 or 54' on the basis of a test 60 of the relative degree of the functions $a_k M^{(k)}(z)$ and $b_k W^{(k)}(z)$, both of which functions depend upon the remainder polynomial as previously shown. The expressions $a_k$ and $b_k$ are expressly defined in FIG. 2a merely to simplify the expressions.

FIG. 2b executes three major processing steps. Possible error in the message portion of the codeword is first located by obtaining the roots of the error locator polynomial W (z). This carried out in straight forward fashion by substitution and the error list is acquired. The deg ($W^{(k)}$) must also meet an independent limiting constraint: the number of errors must be within the correctable range. Assuming that the codeword is correctable, the correct values for the located message error(s) are then determined. Where conditions do not permit correction of all errata, it is understood to apply strategies which protect against miscorrection and permit a controlled degradation of correction system performance. Error in the check portion of the codeword may also be located for certain internal purposes of the error correction system (such as the creation of erasures).

It can be demonstrated that the embodiment of FIGS. 2a and 2b will correct any error pattern of Hamming weight t where 2t<d. The proof of this assertion is not essential to the understanding of, or the scope of the invention.

An example will serve to demonstrate the operation of the invention. Assume that the information stream is encoded in an RS code of length 15. The code is further characterized by generator polynomial $$G(z) = \prod_{i=1}^{d-1=6} (z - \alpha^i)$$

where $\alpha$ is a root of $x^4+x+1$ in the field GF ($2^4$). This code has distance d=7. To aid the reader in following the example, Table 1 gives the logarithmic relations peculiar to the context of the example.

TABLE 1

| Logarithmic Tables for GF ($2^4$) ($\alpha$ = root of $x^4 + x + 1$) | | | | | | | | |
|---|---|---|---|---|---|---|---|---|
| Logs | | | | | Antilogs | | | |
| log | 1 | $\alpha$ | $\alpha^2$ | $\alpha^3$ | log | 1 | $\alpha$ | $\alpha^2$ | $\alpha^3$ |
| 0 | 1 | 0 | 0 | 0 | 3 | 0 | 0 | 0 | 1 |
| 1 | 0 | 1 | 0 | 0 | 2 | 0 | 0 | 1 | 0 |
| 2 | 0 | 0 | 1 | 0 | 6 | 0 | 0 | 1 | 1 |
| 3 | 0 | 0 | 0 | 1 | 1 | 0 | 1 | 0 | 0 |
| 4 | 1 | 1 | 0 | 0 | 9 | 0 | 1 | 0 | 1 |
| 5 | 0 | 1 | 1 | 0 | 5 | 0 | 1 | 1 | 0 |
| 6 | 0 | 0 | 1 | 1 | 11 | 0 | 1 | 1 | 1 |
| 7 | 1 | 1 | 0 | 1 | 15 | 1 | 0 | 0 | 0 |
| 8 | 1 | 0 | 1 | 0 | 14 | 1 | 0 | 0 | 1 |
| 9 | 0 | 1 | 0 | 1 | 8 | 1 | 0 | 1 | 0 |
| 10 | 1 | 1 | 1 | 0 | 13 | 1 | 0 | 1 | 1 |
| 11 | 0 | 1 | 1 | 1 | 4 | 1 | 1 | 0 | 0 |
| 12 | 1 | 1 | 1 | 1 | 7 | 1 | 1 | 0 | 1 |
| 13 | 1 | 0 | 1 | 1 | 10 | 1 | 1 | 1 | 0 |
| 14 | 1 | 0 | 0 | 1 | 12 | 1 | 1 | 1 | 1 |

Applying equation 5 to this example G(z) there is obtained $$g(z) = \prod_{i=1}^{6} (z - \alpha^i) = z^5 + \alpha^8 z^4 + \alpha^4 z^3 + \alpha^8 z^2 + \alpha^5 z + \alpha^5$$

The message locations are $\alpha^6, \alpha^7, \ldots \alpha^{14}$ and using equation 9 one obtains the expression $$f(X) = X^{-1} \sum_{k=0}^{5} g_k \alpha^{2k}/(\alpha^k - X)$$

For the check symbols at field locations 0 through 5 inclusive the values of $g_k$ are

| k = | 0 | 1 | 2 | 3 | 4 | 5 |
|---|---|---|---|---|---|---|
| g = | $\alpha^5$ | $\alpha^5$ | $\alpha^8$ | $\alpha^4$ | $\alpha^8$ | $\alpha^0$ |

In like manner there is tabulated $f(\alpha^k)$:

| k = | 6 | 7 | 8 | 9 | 10 | 11 | 12 | 13 | 14 |
|---|---|---|---|---|---|---|---|---|---|
| $f(\alpha^k)$ | $\alpha$ | $\alpha^{10}$ | $\alpha^0$ | $\alpha^6$ | $\alpha$ | $\alpha^{13}$ | $\alpha^{14}$ | $\alpha^{12}$ | $\alpha^{14}$ |

Suppose that the example received word contains three errors at the field locations $X_1$, $X_2$ and $X_3$ exhibiting erroneous values $Y_1$, $Y_2$ and $Y_3$ distributed as follows:

| i | 1 | 2 | 3 |
|---|---|---|---|
| $X_i$ | $\alpha^4$ | $\alpha^6$ | $\alpha^7$ |
| $Y_i$ | $\alpha^0$ | $\alpha^2$ | $\alpha^4$ |

In the example at hand, locations k=0 through 5, inclusive, are the checks and locations k=6 through 14, inclusive, convey message data.

To obtain the coefficients of the remainder polynomial, equation 11 is applied to field locations corresponding to the correct checks, here, $k \neq 4$, thus:

$$r_k = g_k \alpha^k \sum_{i=2}^{3} \frac{Y_i}{f(X_i)(\alpha^k - X_i)} \quad k \neq 4$$

For the case k=4 one obtains $$r_4 = Y_i + g_4 \alpha^4 \sum_{i=2}^{3} \frac{Y_i}{f(X_i)(\alpha^4 - X_i)}$$

(The difference in form for $r_h$ in the message portion and the check portion of the codeword is attributable to notation. In a more compact, form-invariant notation, the sum over i would range from 1 to 3 yielding in a single expression the equivalent of both expressions above.)

With the aid of the Table 1, these relations yield

| k | 0 | 1 | 2 | 3 | 4 | 5 |
|---|---|---|---|---|---|---|
| r | $\alpha^4$ | $\alpha^6$ | $\alpha^{11}$ | $\alpha^4$ | $\alpha^7$ | $\alpha^{13}$ |

The iterations of FIG. 2a can be developed for two situations: the checks may be treated in true order, $\beta_k = \alpha^k$ for k=0, 1, ... 5; or, the ordering of the checks may be arbitrarily taken. For the ordered case, the iterations of FIG. 2a yield

| k | $H^{(k)}(z)$ | $V^{(k)}(z)$ | $N^{(k)}(z)$ | $\beta^{(k)}(z)$ | $a_k$ | $b_k$ |
|---|---|---|---|---|---|---|
| 0 | 1 | 0 | 0 | 1 | $\alpha^4$ | $\alpha^5$ |
| 1 | $\alpha^4$ | $\alpha^5$ | 0 | $z+1$ | $\alpha^{10}$ | $\alpha^{14}$ |
| 2 | $\alpha^4(z+\alpha)$ | $\alpha^5(z+\alpha)$ | $\alpha^{14}$ | $\alpha^{14}z + \alpha^5$ | $\alpha^6$ | $\alpha^{12}$ |
| 3 | $\alpha^{10}z$ | $\alpha^{11}$ | $\alpha^{14}(z+\alpha^2)$ | $(\alpha^{14}z+\alpha^3)(z+\alpha^2)$ | $\alpha^{15}$ | $\alpha^{10}$ |
| 4 | $\alpha^{10}z(z+\alpha^3)$ | $\alpha^{11}(z+\alpha^5)$ | $\alpha^{12}z+\alpha^{11}$ | $\alpha^8z^2+\alpha^4z+\alpha^7$ | $\alpha^8$ | $\alpha^{12}$ |
| 5 | $\alpha^4z^8+z+\alpha^8$ | $\alpha^6z^2+\alpha^2z+\alpha^5$ | $(\alpha^{12}z+\alpha^{11})(z+\alpha^4)$ | $(\alpha^8z^2+\alpha^4z+\alpha^7)(z+\alpha^4)$ | 0 | 1 |
| 6 | — | — | $(\alpha^{12}z+\alpha^{11})(z+\alpha^4)$ | $(\alpha^8z^2+\alpha^4z+\alpha^7)(z+\alpha^4)$ | — | — |

Consider now another ordering:

| $\beta_0$ | $\beta_1$ | $\beta_2$ | $\beta_3$ | $\beta_4$ | $\beta_5$ |
|---|---|---|---|---|---|
| $\alpha^0$ | $\alpha^1$ | $\alpha^2$ | $\alpha^4$ | $\alpha^3$ | $\alpha^5$ |

The same iterative operations yield

| k | $H^{(k)}(z)$ | $V^{(k)}(z)$ | $N^{(k)}(z)$ | $\beta^{(k)}(z)$ | $a_k$ | $b_k$ |
|---|---|---|---|---|---|---|
| 0 | 1 | 0 | 0 | 1 | $\alpha^4$ | $\alpha^5$ |
| 1 | $\alpha^4$ | $\alpha^5$ | 0 | $z+1$ | $\alpha^{10}$ | $\alpha^{14}$ |
| 2 | $\alpha^4(z+\alpha)$ | $\alpha^5(z+\alpha)$ | $\alpha^{14}$ | $\alpha^{14}z+\alpha^5$ | $\alpha^6$ | $\alpha^{12}$ |
| 3 | $\alpha^{10}z$ | $\alpha^{11}$ | $\alpha^{14}(z+\alpha^2)$ | $(\alpha^{14}z+\alpha^5)(z+\alpha^2)$ | $\alpha^6$ | $\alpha^5$ |
| 4 | $\alpha^{10}z(z+\alpha^4)$ | $\alpha^{11}(z+\alpha^4)$ | $z+\alpha^5$ | $\alpha^4z^2+\alpha^{14}z+\alpha^4$ | $\alpha^8$ | $\alpha^2$ |
| 5 | $\alpha^4z^2+z+\alpha^6$ | $\alpha^6z^2+\alpha^2z+\alpha^5$ | $(z+\alpha^5)(z+\alpha^5)$ | $(\alpha^4z^2+\alpha^{14}z+\alpha^4)(z+\alpha^3)$ | $\alpha$ | $\alpha^{11}$ |
| 6 | — | — | $\alpha^3z^2+\alpha^{12}z+\alpha^6$ | $z^3+\alpha^2z^2+\alpha^2z+\alpha^2$ | — | — |

The further steps of FIG. 2b direct that the roots of $W^{(6)}(z)$ be located. One can verify that the hypothesized error locations $\alpha^4$, $\alpha^6$ and $\alpha^7$ (and no others) satisfy $W^{(6)}(z)=0$. The polynomial $W^{(6)}(z)$ is of degree $3 < (d/2)$ confirming further processing.

To the desired rational function $N^{(d-1)}(z)/W^{(d-1)}(z)=F(z)$, L'Hopital's rule is applied to ascertain the value Y associated with respective roots $X_i$ of $W^{(d-1)}(z)$. Following expression 13a above one obtains $$f(\alpha^6)N^{(6)\prime}(\alpha^6)/W^{(6)\prime}(\alpha^6) = \alpha \frac{\alpha^8}{\alpha^7} = \alpha^2$$

for the error at location $\alpha^6$. In like manner the error value for location $\alpha^7$ is $$f(\alpha^7)N^{(7)\prime}(\alpha^7)/W^{(7)\prime}(\alpha^7) = \alpha^{10}\frac{\alpha^7}{\alpha^{13}} = \alpha^4$$

The foregoing embodiment was intended for apparatus which does not create erasures. The next embodiment considered is intended for operation with apparatus which locates and corrects up to e errors ($Y_1, Y_2, \ldots Y_e$) at message locations $X_1, X_2, \ldots X_e$, a further t-e errors at check locations $X_{e+1}, X_{e2}, \ldots X_t$, h erasures at message locations $X_1^*, X_2^* \ldots, X_h^*$ and s-h erasures at the check locations.

It is sufficient to assume that the value assigned to a message erasure is 0. The remainder polynomial coefficient is then determined for each nonerased check location $\alpha^k$: then $$r_{\alpha k} = g_\alpha k^{\alpha k}\left(\sum_{i=1}^{e}\frac{Y_i}{f(X_i)(\alpha^k - X_i)} + \sum_{i=1}^{h}\frac{Y_i^*}{f(X_i^*)(\alpha^k - X_i^*)}\right) \quad \text{equ (14)}$$

The error locator polynomial now generalizes to $$W(z) = \prod_{i=1}^{e}(z - X_i)\prod^{h}(z - X_i^*) \quad \text{equ (15)}$$

The quantity in brackets for equation (14) is decomposed to yield the rational poynomial function as before, ie.

$$\frac{N(z)}{W(z)} = \sum_{i=1}^{e}\frac{Y_i}{f(X_i)(z - X_i)} + \sum_{i=1}^{h}\frac{Y_i^*}{f(X_i^*)(z - X_i^*)}$$

Figure 3A:
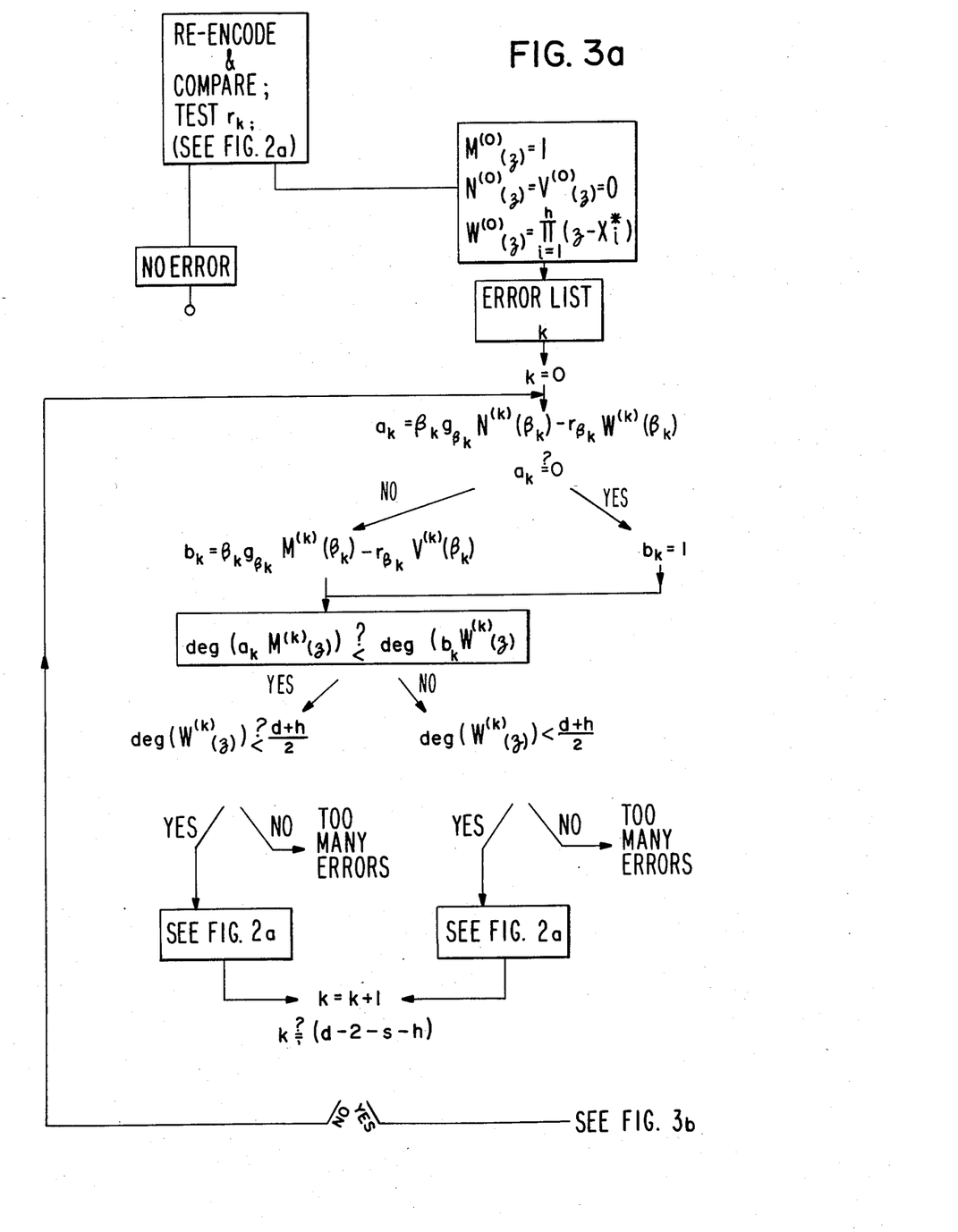
FIGS. 3a and 3b describe an embodiment suitable for erasure creating systems.
Figure 3B:
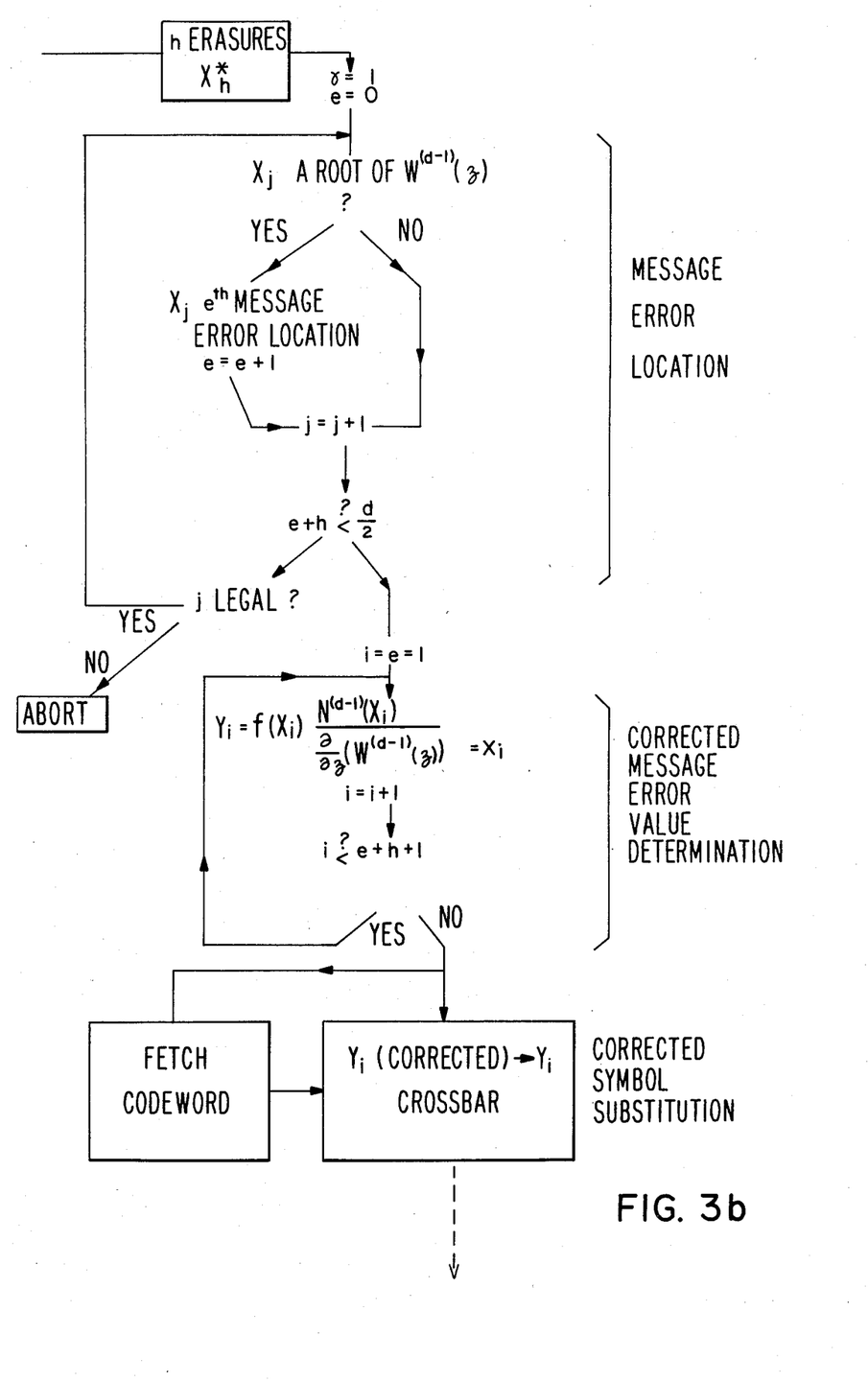

The operation of error corrector 22 in this more general embodiment is described in FIGS. 3a and 3b. It is necessary, as in the preceeding example, to introduce an index $\beta_0, \beta_1, \ldots \beta_{d-2-s+h}$ to label the non-erased check locations in any order.

The operations for the multiple errata embodiment of FIGS. 3a and 3b differ from the embodiment of FIGS. 2a and 2b (no erasures) primarily in the initialization for the iterative operations.

The treatment for errata in the check portion of the received word can be obtained in a manner parallel to that accorded for message errata or the corrected message errata may be re-encoded. The treatment of check error is important for erasure creation operations as described for yet another embodiment as described below.

Memory media (and some communication systems) utilize parallel sub-channels to assemble symbols stored or transmitted through the sub-channels. These sub-channels are usually physically distinct; an example is a multi-track magnetic storage device wherein each track develops a code symbol seriatum and an entire codeword is then presented to the error recovery processor system, comprehending de-interleaver (where applicable), remainder generator and error corrector. Certain tracks are intended to convey the redundancy portion of the codeword and another set of tracks convey the message symbols. The code is systematic, in that the message and redundancy symbols are distinguishable.

The embodiments, described above, exploit the distinction between message and redundancy symbols to gain an advantage in decoupling error location from error value when the error location is within the check portion of the codeword. Therefore if error can be localized to the check symbols, the load on error corrector 22 or equivalent can be massively reduced. It is also recognized that maximum distance separable codes, such as the Reed-Solomon codes, can, in an abstract sense, treat message and redundancy symbols without distinction. If, for physical reasons, there is a statistically significant tendency for systematic error distribution among the sub-channels, a Reed-Solomon code permits a dynamic re-allocation of the identification of message and redundancy symbols as perceived by the error corrector. This re-allocation is triggered in response to some appropriate criterion which indicates greater likelihood of error associated with particular track(s). The re-allocation is then carried out in suitable apparatus which simply transforms the input signals accepted by the error corrector and the error correction is optimized by the assignment of error tending tracks to the check symbol portion of the codeword, as perceived by the error corrector of the present invention.

Figure 4:
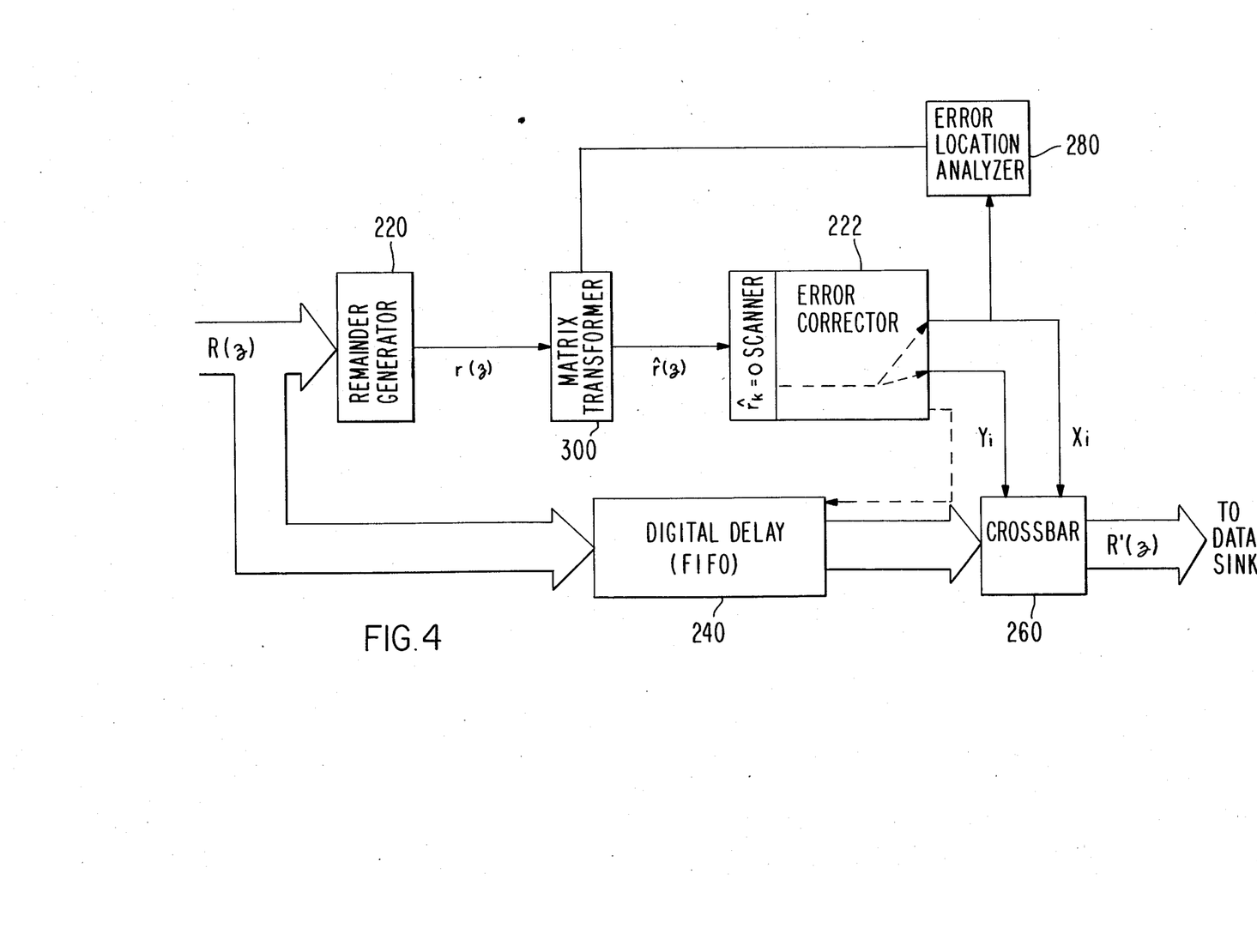
FIG. 4 illustrates an embodiment for optimizing the invention through re-allocation of code symbols between message and redundancy portions of the codeword.

The third embodiment is shown in schematicized form in FIG. 4 wherein matrix transformer 300 is disposed between remainder generator 220 and the error corrector 222. Error location analyzer 280 monitors the distribution of error in the received word and applies the desired criterion to determine whether re-allocation is required and the nature thereof. Matrix transformer 300 is then re-initialized to operate on the column vector present at the output of the remainder generator 220 and to transform same for operation thereon, preferably by the error corrector 222 functioning in accord with FIGS. 3a and 3b. Notice that re-initializations of the matrix transformer 300 occur sporadically and therefore at relatively low rate (as determined by the details of the criterion and the physical source of error). Therefore, the throughput of the system is optimized by the predictive action which, in a probablistic sense, localizes the incidence of error within the codeword. A preferred criterion of re-allocation is the incidence of any change in error pattern. Beginning and termination of a prolonged burst as well as random bit error will therefore be treated equally under this (worst case) criterion. It is important to recognize that a specific criterion is not the point of the invention, but rather the combination of the error corrector of FIGS. 3a and 3b together with a maximum distance separable code, an error location analyzer, matrix transformer and crossbar.

The critical attribute of this embodiment is that for long dropout situations where error location conditions are relatively static, the output of matrix transformer 300 furnishes precisely the information (corrected $Y_i$) required for the correction function of the crossbar. (This is the principal which controls the structure of the transformation). The error corrector in such instance has no substantial function beyond confirmation that there are no other errors in the current codeword. This is simply accomplished by scanning the matrix transformer output for expected zero value symbols which mark non-erroneous character positions. For the expected error location pattern, the input and output of the error corrector process does not differ; consequently the matrix transformer, operating at channel rate, can furnish the necessary information directly (via bypass 310) to the crossbar. Correction during long bursts is therefore accomplished without substantial time penalty.

Suppose that the error location analyzer has defined a set of error locations $\{X_1, \ldots X_t\} = T$ exhibiting the corresponding (erroneous) values $\{Y_1, \ldots Y_t\}$. A designated set of bytes output from the remainder generator comprise the set T of check symbols as perceived by the error corrector. This identification is transient and will be maintained until error distribution among the symbols of the entire codeword causes the error location analyzer revises the transformation. A random error, or the incidence of a new burst represent changes to which the error corrector 220 responds as above described, to locate and determine corrected error values and causing error location analyzer 280 to adjust the transformation executed by the matrix transformer 300 for treatment of subsequent received words.

Check symbol correction is a subfunction of error corrector 220 which operates upon errata located in the check portion of the word under scrutiny. Here, the reader is reminded that these are the checks as received by the error corrector and need not be identified with the set of check symbols created by the originating encoder. In one practical application, this apparatus is an encoder, which may be realized in diverse forms. Data rates in the error recovery system will limit acceptable choices for this component as will other factors such as cost, etc. The check corrector also compares the re-encoded word with the received word to establish locations of errata in the check portion of the word.

It is the function of the error location analyzer to rank the several subchannels or tracks in an ordering based upon likelihood of encountering errata. The code word contains a set of T check symbols and another set of M message symbols. The code symbols are each associated with an identifiable corresponding subchannel or track. Initially, the set T corresponds to the check symbols created by the originating encoder. During operation, the incidence of error will cause the set T to evolve to contain the most error likely symbols (corresponding to physical sub-channels). The set T will be treated as a set of erasures. In a specific application the several subchannels correspond to a multi-track magnetic tape apparatus. The error corrector operates most efficiently if the errata are localized to the check portion of the putative codeword, which check portion is not static, but is instead re-identified by the error location analyzer throughout operation.. In the present embodiment the error location analyzer collects data for labeling the performance of the several subchannels. This operation is carried out preferably by establishing a "pecking order" among the T redundancy channels, thereby ordering the likelihood of encountering error within the set of redundancy bearing subchannels. Some criteria is adapted to cause an update of the set of T subchannels. That is, the symbols perceived by the error corrector as redundancy symbols may be revised to substitue a (former) message symbol for a (former) redundancy symbol in the subsequent error correction operations.

Several aspects of the updating operation are preferred. The decision to replace one of the T subchannels of the current T set with an M subchannel is preferably implemented by promoting the most reliable of the present T subchannels to an M status as perceived by the error corrector and replacing the least reliable of the present T set with the former M symbol bearing subchannel. The formerly least reliable of the T set is then promoted together with its brethren within the pecking order of the newly updated T set. Subsequent updates will place the new member of the T set in its proper place within the pecking order.

The error location analyzer may also execute updates which do not exchange the perceived identity of members of the M and T sets, but simply re-arrange the pecking order.

Whenever there is indicated a re-allocation of subchannel identification (as perceived by the error corrector) between the T and M symbol sets, a matrix transformation is to be executed by matrix transformer 300 upon the coefficients of the remainder polynomial r(z). The distribution has been placed, above, on the check symbols perceived as such by the error corrector 220. This set of symbols is selected without special attention to the permanent set of checks created as such by the originating encoder. The matrix transformer executes the prevailing transformation on the vector comprising the set of coefficients $r_k$, the remainder polynomial of each received word. It is understood that the critical property of the transformation matrix is that, applied to the expected pattern of errata, the corrected errata values $Y_i=$ will be obtained. For an index p ranging over the erased symbol set T, excepting therefrom the location p, and another index z ranging over the set of encoder created (permanent) check tracks, the matrix is given by $$A_{p_o,z} = \pi_{p \in T - \{p_o\}} \left( \frac{z - p}{p_o - p} \right)$$

By this construction, for an errata pattern E the check set R created by the originating encoder and the "transient" check set T are related as $$\sum_{z \in T} S_T(z) z^1 = \sum_{i=1} E_i z_i^1 = \sum_{z \in R} S_R(z) z_i^1$$

such that $$S_T(p_o) = \sum_{z \in R} S_R(z) A_{p_o,z}$$

The matrix can also be in terms of a check error location polynomial $$W_T(z) = \pi_{z \in T} (z - p) \text{ giving}$$

$$A_{p,z} = \dot{W}_T(z)/((z - p)(W'_T(p)))$$

For a particular received word $$S_T(p) = \sum_{i=1}^{t} Y_i A_{p1} X_i$$

and from the above $$S_T(p) = \sum_{i=1}^{t} \frac{Y_i W_T(X_i)}{(X_i - p) W_T(p)}$$

Multiplying the above by $W'_T(p)$, replacing p by z and defining $F(z) = -W'_T(z) S_T(z)$, for $z \in T$ and identifying f $(X_i)$ with $W_T^{-1}(X_i)$ there is obtained $$F(z) = \frac{Y_i}{f(X_i)(z - X_i)}$$

This is equivalent to equation 13. One skilled in the art will therefore recognize that the error location analyzer creates a set of erasures to accord with an expectation of a continued errata pattern, and on that basis defines a transformation matrix, which upon execution, supplies the erasure correction.

Figure 5:
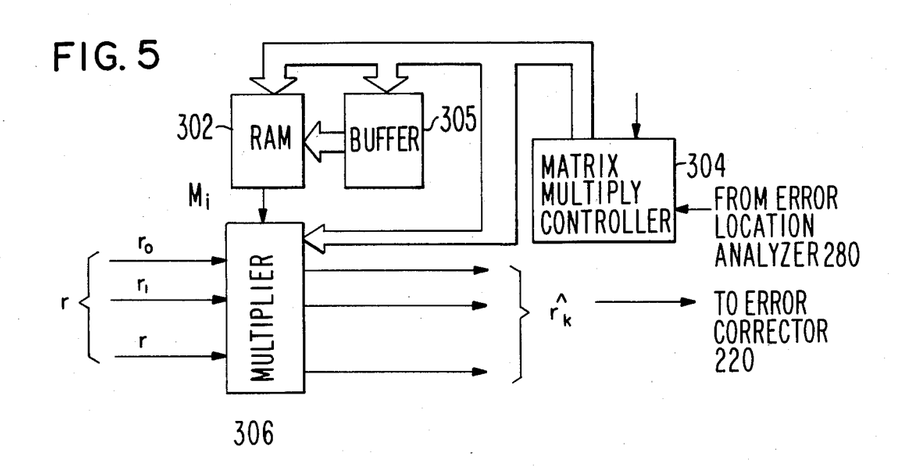
FIG. 5 illustrates the conceptual structure of the matrix transformer.

The matrix transformer operates upon the byte output of the remainder generator to effect the transformation described above. The matrix resides in prom 302 where it may be altered by the matrix controller 304, preferably operating through a buffer structure 305. The matrix elements are retreived from prom 302 and applied to the vector components $r_i$ to effect the matrix product $$r_j = \Sigma\ M_{ij} r_i$$

in a network 304 of selectable OR gates and adders operating under control of transformation controller 305. Structure to execute high speed matrix operations is well within the state of the art and the particular architecture implementing the operation need not be further particularized for the successful practice of the invention. Commercially available apparatus is reviewed in Compute Magazine, vol. 16, #6 (June, 1983).

Discussion of an exemplary crossbar is facilitated by a very brief description of apparatus constructed to implement the invention. This system operates upon 34 track serial magnetic tape. A shortened RS (34,6) code is employed providing input information at 1.75 MHz per track. The digital delay accepts the 28 character wide message portion of the data at the channel rate (56 mb/s) and after a fixed delay of approximately 3720 bit intervals, the corrected codeword emerges from the crossbar output register at 56 mb/s for transmission to the data sink. The occurence of random bit errors in addition to prolonged dropouts causes the error correcting process to slow relative to the fixed delay with some possible degree of degradation in performance depending upon the frequency of such random bit errors and the number of prolonged dropouts in progress concurrently. Performance under pure dropout conditions will suffice to describe the operation of the crossbar.

Figure 6:
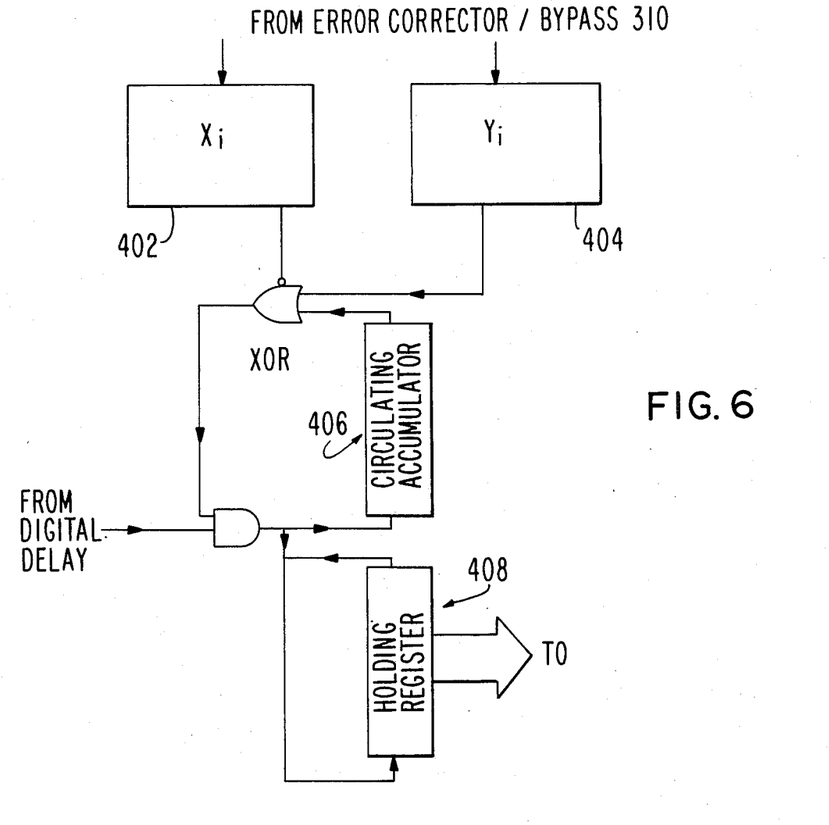
FIG. 6 shows the conceptual structure of the crossbar

Turning now to FIG. 6 there is shown a conceptual illustration of the crossbar 26 or 260. A preferred operational philosophy is described as execution of a fixed number of corrections (the maximum number of correctable symbols) independent of the actual number of errata in the current codeword. Thus, some, or all of the mandated correction operations are pseudo-corrections. The correction location data, $X_i$, i=1 through 6 (the maximum number of corrections) fill the correction location register/indexer 402 while the corresponding corrected errata values fill the correction value register 404. Pseudo-corrections are directed to a nonexistent location X. An alternate treatment of pseudo-corrections is to XOR with 0 a bit of a real, but otherwise correct character. In precise terminology errata location register/indexer 402 executes what is commonly regarded as the crossbar function. That is, for a selected one of 6 of the 28 message character bearing tracks plus 1 phantom track, a corresponding bit is selected from correction value register 404 to be XORed with the appropriate bit of the corresponding symbol as it emerges from the digital delay 240. The actual bit correction operation is accomplished in circulating accumulator 406. This component may be regarded as a re-entrant 28 bit shift register including in series, a gated XOR. The $q^{th}$ bit of each of the 28 message characters is loaded into this re-entrant register and the entire set rotates 6 times through the register 406. On each revolution, one of the 6 corrections (or pseudo-corrections) is accomplished. The erroneous bit from the re-entrant register and the correct bit from correction value register 404 are applied to the XOR, the operation is gated by the error location indexer 402 and the circulation continues. The output of the XOR is directed both to the input of the shift register and to another shift register 408 (operating in lock step with register 406) which serves as the output buffer.

While the invention has been particularly shown and described with reference to particular embodiments thereof, it will be understood by those skilled in the art that the foregoing and other changes in form and details may be made without departing from the scope and spirit of the invention.

What is claimed is:

1. The method of correcting as many as i errors encountered in an information unit received by a digital communication terminal, said information unit algebraically encoded as a polynomial in a variable z, said code, a systematic code having a distance d and generator polynomial G (z), i<d/2, said information unit comprising message symbols and redundancy symbols, said method comprising the steps of:
    (a) retaining at least said message symbols of said information unit temporarily,
    (b) forming the remainder polynomial r(z) of the received information unit, mod G (z),
    (c) decomposing the polynomial r(z) into a rational function of two polynomials, $F(z)=N(z)/W(z)$, the degree of N(z)<the degree of W(z) and degree W(z) no more than the maximum number of correctable errors, said polynomial W (z) of degree $\delta$ and having roots corresponding to said error locations and said polynomial N(z) of degree less than $\delta$
    (d) determining the roots $X_i$ of W(z) whereby the field locations $X_i = \alpha^i$ for message symbol errors are determined in powers of a primitive element $\alpha$ of the code,
    (e) obtaining the corrected value $Y_i$ of each said erroneous symbol corresponding to root $X_i$ from a relation $Y_i = f(X_i)\ N'(X_i)/W'(X_i)$, said $f(X_i)$ dependent only upon said G(z),
    (f) retrieving said information unit and substituting said corrected value(s) corresponding to error locations $X_i$ to form a corrected information unit, and
    (g) transmitting said corrected information unit to a data sink.

2. In a digital communication system for transmitting digital information from an originating data source to a data sink, apparatus for correction of no more than i errata in received digital words obtained from a plurality of physical channels, each said digital word comprising a corresponding plurality of symbols, a first group of said symbols comprising a message portion and a second group of said symbols comprising a check portion derived from said message portion in accord with a systematic, maximum distance separable code having distance d and generator polynomial G (z), i less than (d+h)/2 and h, the number of erasures, no greater than d, said apparatus comprising
    (a) temporary storage means for retaining in turn, each said received digital word for an interval,
    (b) remainder generating means for obtaining in turn, from each said received word the ordered set of coefficients expressing the remainder polynomial, r(z) mod G(z), corresponding to said received word, whereby each said coefficient is associated with an identifiable one of said physical channels,
    (c) matrix transformation means for operating upon said ordered set of coefficients to transform the values of said ordered set r(z) to form a transformed ordered set of values r'(z) corresponding to said ordered set, (d) scanning means responsive to a change in said r(z) in successive information units for detecting such change and generating an error pattern change signal, (e) error corrector means operative in response to said error pattern change signal in said r(z) comprising (i) means for decomposing the polynomial r (z) into a rational polynomial $F(z)=N(z)/W(z)$, the degree of polynomial $N(z) <$ degree of polynomial $W(z)$ and the degree of $W(z)$ no greater than the maximum number of correctable errata and for retaining representations of said polynomials $N(z)$ and $W(z)$, (ii) search means operative upon said representation of said representation of $W(z)$ for determining the roots $X_i$ of said $W(z)$, whereby the field locations $X_i = \alpha^1$ of message symbol errata corresponding to said roots are determined in powers of a primitive element $\alpha$ of said code, (iii) corrected root value determination means for associating with each said root $X_i$ of $W(z)$, the correct corrected value $Y_i = F(X_i)N(X_i)/W'(X_i)$, (iv) errata location analyzer means for establishing the relative likelihood of the occurence of errata among the respective symbols of said received word for creating a hierarchy of said channels associated with said symbols in accord with said relative likelihood, and means for establishing the composition of said transformation matrix from said heirarchy whereby coefficients corresponding to the most error likely channels form the subset of transformed coefficients treated by said error corrector as redundancy channels, (f) corrected value register means for receiving said pairs of quantities $Y_i$, $X_i$ from said corrected root value determination means if said error correction means has been activated by said scanning means, or alternatively receiving said $\hat{r}_j$ and said index j from said matrix transformation means, and (g) crossbar means responsive to said corrected value register for retreiving said temporarily stored information unit and substituting for the information at location $X_i$ within said information unit, the corresponding corrected value $Y_i$, and transmitting the now corrected information unit to said data sink.

* * * * *

Disclaimer and Dedication

4,633,470.—*Lloyd R. Welch*, La Canada; *Elwyn R. Berlekamp*, Berkeley, both of Calif. ERROR CORRECTIONS FOR ALGEBRAIC BLOCK CODES. Patent dated Dec. 30, 1986. Disclaimer and Dedication filed Dec. 22, 1989, by the assignee, Cyclotomics, Inc.

Hereby disclaims and dedicates to the Public all claims of said patent.
[*Official Gazette April 10, 1990*]